United States Patent
Kubena et al.

(10) Patent No.: US 12,191,867 B1
(45) Date of Patent: Jan. 7, 2025

(54) IN-SITU PHASE NOISE COMPENSATION FOR PHONONIC FREQUENCY COMBS

(71) Applicant: HRL Laboratories, LLC, Malibu, CA (US)

(72) Inventors: Randall L. Kubena, Malibu, CA (US); Walter S. Wall, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 18/208,894

(22) Filed: Jun. 13, 2023

Related U.S. Application Data

(60) Provisional application No. 63/404,851, filed on Sep. 8, 2022.

(51) Int. Cl.
  H03L 7/093 (2006.01)
  H03L 7/099 (2006.01)

(52) U.S. Cl.
  CPC ............ *H03L 7/093* (2013.01); *H03L 7/0991* (2013.01)

(58) Field of Classification Search
  CPC ........................................ H03L 7/093
  USPC ............................................. 331/2
  See application file for complete search history.

(56) References Cited

U.S. PATENT DOCUMENTS

| | | | |
|---|---|---|---|
| 4,070,635 A | 1/1978 | Healey, III | |
| 4,132,964 A | 1/1979 | Wilcox | |
| 7,237,315 B2 | 7/2007 | Kubena | |
| 7,459,099 B2 | 12/2008 | Kubena | |
| 7,750,535 B2 | 7/2010 | Kubena | |
| 7,851,971 B2 | 12/2010 | Chang | |
| 8,601,607 B2 | 12/2013 | Hagmann | |
| 8,765,615 B1 | 7/2014 | Chang | |
| 8,994,465 B1 | 3/2015 | Kubena | |
| 10,110,198 B1 | 10/2018 | Kubena | |
| 10,389,392 B1 | 8/2019 | Kubena | |
| 10,819,276 B1 | 10/2020 | Kubena | |

(Continued)

FOREIGN PATENT DOCUMENTS

| KR | 10-2008-0044977 | 5/2008 |
|---|---|---|
| KR | 10-2012-0132987 | 12/2012 |

(Continued)

OTHER PUBLICATIONS

From U.S. Appl. No. 17/677,849 (now U.S. Pat. No. 11,606,098), Notice of Allowance dated Nov. 18, 2022.

(Continued)

*Primary Examiner* — Joseph Chang
(74) *Attorney, Agent, or Firm* — Ladas & Parry, LLP

(57) ABSTRACT

A phononic frequency comb enhanced clock, including a nonlinear resonator configured to generate a phononic frequency comb in response to a drive signal and an AM-to-PM noise correction circuit. The AM-to-PM noise correction circuit includes a transfer function circuit which includes a two-channel PLL and a DSP. The two-channel PLL has one channel input with the phononic frequency comb and another channel input with at least a portion of the drive signal. The DSP is configured to periodically divide a PM noise of a predetermined tooth of the phononic frequency comb by an AM noise of the portion of the drive signal to generate periodically updated noise correction signals. The clock further includes a phase shifter having an input coupled to an output of the digital signal processor and another input connected to a frequency signal of a preselected tooth of the phononic frequency comb.

27 Claims, 9 Drawing Sheets

(56) References Cited

U.S. PATENT DOCUMENTS

| | | |
|---|---|---|
| 11,156,897 B2 | 10/2021 | Kubena |
| 11,239,823 B1 | 2/2022 | Kubena |
| 11,275,099 B1 | 3/2022 | Sorenson |
| 11,431,293 B1 | 8/2022 | Kubena |
| 11,563,420 B1 | 1/2023 | Kubena |
| 11,567,147 B1 | 1/2023 | Kubena |
| 11,606,098 B1 | 3/2023 | Kubena |
| 2010/0321117 A1 | 12/2010 | Gan |
| 2012/0294319 A1 | 11/2012 | Maleki |
| 2017/0047893 A1 | 2/2017 | Nguyen |
| 2018/0157148 A1 | 6/2018 | Kim |
| 2019/0250198 A1 | 8/2019 | Kubena |
| 2020/0158769 A1 | 5/2020 | Liu |

FOREIGN PATENT DOCUMENTS

| | | |
|---|---|---|
| WO | 2014-018444 | 1/2014 |
| WO | 2019-217668 | 11/2019 |

OTHER PUBLICATIONS

PCT International Search Report and Written Opinion from PCT/US2020/051863 dated Jan. 4, 2021.

PCT International Preliminary Report on Patentability Chapter I from PCT/US2020/051863 dated Apr. 7, 2022.

Analog Devices, Phase Detector/Frequency Synthesizer model ADF4002, Norwood, MA, 2006-2015, 20 pages.

Askari, S. et al., "Near-Navigation Grade Quad Mass Gyroscope With Q-Factor Limited by Thermo-Elastic Damping, " Solid-State, Actuators, and Microsystems Workshop Technical Digest, Hilton Head, South Carolina, USA, 2016, pp. 254-257.

Bennett, S. P. et al., "Magnetic Field Response of Doubly Clamped Magnetoelectric Microelectromechanical AlN—FeCo Resonators," Applied Physics Letters 111, 252903 (2017), 6 pages.

Bhatia, A. et al., "Linearization of Phase-Modulated Analog Optical Links using a Four-Wave Mixing Comb Source," Optics Express, DOI: 10.1364/OE 22.030899, Dec. 4, 2014, 11 pages.

Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.

Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).

Ganesan, A., et al., "Phononic Frequency Combs for Engineering MEMS/NEMS Devices with Tunable Sensitivity," 2019 IEEE (4 pages).

Ganesan, A. et al., "Phononic Frequency Comb via Intrinsic Three-Way Mixing," Physical Review Letters, PRL 118, 033903 (2017), (5 pages).

Hati, A. et al., "Oscillator PM noise reduction from correlated AM noise," IEEE Transactions on Ultrasonics, Ferroelectrics, and Frequency Control. vol. 63, No. 3 (Mar. 2016): 463-469.

Hati, A., et al., "Reducing oscillator PM noise from AM-PM noise correlation," Electronics Letters, vol. 50, No. 17 (2014): 1195-1197.

Howe, et al., "PM-AM correlation measurements and analysis," May 2012, IEEE International Frequency Control Symposium Proceedings (pp. 1-5).

Hui, Y. et al., "High Resolution Magnetometer Based on a High Frequency Magnetoelectric MEMS-CMOS Oscillator," Journal of Micromechanical Systems, vol. 24, No. 1, Feb. 2015, pp. 134-143.

Kominis, et al., "A subfemtotesla multichannel atomic magnetometer," Nature, vol. 422, pp. 596-599 (2003).

Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.

Kubena, et al., "A Fully Integrated Quartz MEMS VHF TCXO," 2017 IEEE Frequency Control Symposium, Besancon, Fr., pp. 68-71, Jul. 2017.

Kubena, R. L., et al. "Phononic Comb Generation in High-Q Quartz Resonators", Applied Physics Letters, 116, 053501 (2020).

Leeson, D. B., et al., "Short-term Stability for a Doppler Radar: Requirements, Measurements, and Techniques," Proceedings of IEEE, vol. 54, No. 2, pp. 244-248, Feb. 1966.

Nan, et.al., "Acoustically Actuated Ultra-Compact NEMS Magnetoelectric Antenna," Nature Communications, 8:296, DOI: 10.1038/s41467-017-00343-8 (2017), pp. 1-8.

Neji, N. et al., FPGA Implementation of the CORDIC Algorithm for Fingerprints Recognition Systems, International Journal of Computer Applications, vol. 63, No. 6, Feb. 2013, pp. 39-45.

Pinto, A. N., "Timing Jitter in Optical Communication Systems," Frontiers in Optics, OSA Technical Digest (CD) (Optical Society of America, 2006), paper FMD5 (1 page).

Roy, S., FPGA implementation of 8-point FFT, May 14, 2019 available on-line at https://digitalsystemdesign.in/fpga-implementation-of-8-point-fft (Printed on Apr. 1, 2022).

Sheng, et al., "A Microfabricated Optically-Pumped Magnetic Gradiometer," Applied Physics Letters 110, 031106 (2017), 5 pages.

Trochimiuk, M., "FPGA programming how it works and where it can be used" available online at https://codilime.com/blog/FPGA-programming-how-it-works-and-where-it-can-be-used/ (Printed on Apr. 1, 2022).

Veryaskin, A. "Gravity, Magnetic and Electromagnetic Gradiometry: Strategic Technologies in the 21st century", IOP ebooks, 2018 (57 pages).

Vrba, J., "Squid Sensors: Fundamentals, Fabrication and Applications," edited by H. Weinstock, Kluwer Academic, Dordrecht, The Netherlands, 1996, p. 117.

Wall, W. S., et al., "Phase Noise Transfer in High-Q Quartz Phononic Frequency Combs," 2020 IEEE Ultrasonics Sym., Las Vegas, NV. Sep. 6-11, 2020, 4 pages.

Wang, S. et al., "A MEMS Resonant Accelerometer for Low-Frequency Vibration Detection," Sensors and Actuators A: Physical, 283, Nov. 2018, pp. 151-158.

Wenjie, W. et al., "A Nano-g MEMS Accelerometer for Earthquake Monitoring, " 19th Intern. Conf. on Solid-State Sensors, Actuators and Microsystems (Transducers), DOI 10.1109/Transducers 2017, pp. 599-602.

Yao, et al., "Bulk Acoustic Wave-Mediated Multiferroic Antennas: Architecture and Performance Bound," IEEE Transactions on Antennas and Propagation, vol. 63, No. 8, Aug. 2015, pp. 3335-3344.

Zhai, J., et al., "Detection of Pico-Tesla Magnetic Fields using Magneto-Electric Sensors at Room Temperature," Applied Physics Letters, 88, 062510 (2006), 5 pages.

IN-SITU PHASE NOISE COMPENSATION FOR PHONONIC FREQUENCY COMBS

CROSS REFERENCE TO RELATED APPLICATIONS

This application claims benefit of U.S. Provisional Application No. U.S. 63/404,851 filed Sep. 8, 2022 and entitled "In-situ Phase Noise Compensation for Phononic Frequency Combs," the disclosure of which is herein incorporated by reference in its entirety.

This application is related to U.S. Provisional Patent Application Ser. No. 63/152,506 filed 23 Feb. 2021 entitled "Comb Enhanced Oscillator with AM-to-PM Noise Suppression" and issued as U.S. Pat. No. 11,606,098 on 14 Mar. 2023, and is also related the corresponding Non-Provisional U.S. patent application Ser. No. 17/677,849, filed 22 Feb. 2022, with the same title as the aforementioned provisional patent application U.S. 63/152,506, the disclosures of which are hereby incorporated herein by reference in its entirety.

STATEMENT REGARDING FEDERALLY SPONSORED RESEARCH OR DEVELOPMENT

None.

TECHNICAL FIELD

Clock using phononic frequency combs and more particularly combs having phase noise compensation or reduction.

BACKGROUND

Phononic combs in quartz resonators were first discovered in 2019 at HRL Laboratories (HRL) of Malibu, CA. See, for example, "Phononic Comb Generation in High-Q Quartz Resonators," R. L. Kubena, W. S. Wall, J. Koehl, and R. J. Joyce, *Applied Physics Letters*, 116, 053501, Feb. 4, 2020. Improvement of the phase noise and reduction of cost, size, weight, and power (c-SWaP) of reference oscillators have been continuously demanded.

U.S. patent application Ser. No. 17/677,849 filed 22 Feb. 2022 referenced above discloses measuring the phase noise on one tooth and using that information for correcting the phase noise of other teeth. The corrected tooth can then be used as a reference clock for a digital processor to measure the higher noise on other teeth and perform in-situ filter calculations. Thus, no additional clock is needed for the digital processor.

U.S. Pat. No. 11,156,897 entitled "Enhanced Stability Quartz Oscillators using a Phononic Comb" discloses that certain teeth of a phononic comb can show much smaller frequency modulation sensitivity compared to the drive signal. The smaller frequency modulation sensitivity can reduce phase noise induced by the drive signal. See Phase Noise Transfer in High-Q Quartz Phononic Frequency Combs," W. S. Wall, R. L. Kubena, Y. K. Yong, J. Koehl, and R. J. Joyce, 2020 *IEEE Ultrasonics Sym.*, Las Vegas, NV. Sep. 6-11, 2020. However, the phase noise of the comb teeth may be affected by a natural amplitude modulation (AM) to phase noise modulation (PM) conversion in resonators operating in a nonlinear regime.

Technologies such as radar, navigation, and communication networks rely heavily on accurate and precise timing for state-of-the-art (SOA) operation. Many systems utilize small, compact, low c-SWaP clocks with reduced phase noise. Research and development have been focused on several application including enhanced beamforming, improved communication data rate, and improved clutter suppression in radar.

Beamforming allows multiple RF nodes to be combined in a direct and dynamic way to focus attention on areas and signals of interest, improving signal-to-noise ratio and reducing unwanted interference. This process is particularly important for applications in signal collection and radar. Effective beamforming requires accurate phasing of multiple sensor nodes, which relies in large part on the ability to synchronize the timing and phase of the nodes. This challenge becomes more pronounced at higher frequencies (e.g., mm Wave bands) as shorter wavelengths require more stringent timing/phase control and upconverted (multiplied by M) reference oscillators typically suffer from a 20 log(M) dB increase in phase noise.

Communication networks rely on accurate timing and phase synchronization to ensure successful transmission and reception of data. Errors in timing and/or frequency can lead to misinterpreted bits and significantly increase bit error rate (BER). This problem is more pronounced for networks employing higher order modulation schemes as larger signal-to-noise ratios are generally required for low BER operation. For multi-carrier systems, high-frequency offset phase noise (corresponding to short-term stability) can further increase BER by creating interference between neighboring carriers and consequently limiting the number of carriers that can be packed into a given bandwidth.

Doppler filtering is a common technique for separating target returns from background clutter based on the velocities of scatterers relative to the radar. In many cases, returns from clutter can be substantially larger than those from targets, and if the clock used by the radar contains substantial phase noise, target returns can be masked by high-frequency offset phase noise on clutter returns. By reducing such noise, improved sub-clutter visibility of radar targets can be achieved.

SUMMARY

According to some embodiments, a frequency comb enhanced clock is provided. The clock includes a nonlinear resonator configured to generate a phononic frequency comb in response to a drive signal, and an amplitude modulation (AM) to phase modulation (PM) noise correction circuit. The AM to PM noise correction circuit includes a transfer function circuit which further includes a two-channel phase locked loop detector (PLL) and a digital signal processor (DSP). The two-channel PLL has one channel input with the phononic frequency comb and another channel input with at least a portion of the drive signal. The digital signal processor (DSP) is configured to divide a PM noise of a predetermined tooth (m tooth) of the phononic frequency comb by an AM noise of the portion of the drive signal to generate a noise correction signal. The predetermined tooth may be determined to be the tooth having higher AM/PM noise conversion compared to other teeth of the frequency comb. The clock further includes a phase shifter having an input coupled to an output of the digital signal processor and another input connected to a frequency signal of a preselected tooth ($n^{th}$ tooth) of the frequency comb. The preselected tooth may be selected from the tooth that is least sensitive to frequency changes of the drive signal compared to other teeth of the frequency comb.

In some embodiments, the frequency comb enhanced clock may further include a first resonator for generating the drive signal and a second resonator for preselecting the $n^{th}$ tooth. The first resonator and the second resonator may include MEMS-based oscillators integrated in a single semiconductor substrate, while the nonlinear resonator may include an SC-cut or AT-cut shear-mode oscillator. The DSP may be programmed to optimize fitting parameters of an FIR or IIR filter to match the PM/AM noise in the form of a time dependent function. The DSP may further comprise a memory to store an initial set of the fitting parameters and the updated fitting parameters. The frequency comb enhanced clock may also comprise a PLL with an input connected to the frequency comb and a resonator connected to an output of the PLL for preselecting the $n^{th}$ tooth and configured to output a frequency signal of the $n^{th}$ tooth. The resonator may be configured to output the preselected tooth to the phase shifter.

According to some embodiments, the resonator outputs the corrected frequency signal of the $n^{th}$ tooth to the DSP for internal timing reference and to the dual channel PLL for front-end demodulation of the AM noise of the drive signal. The dual channel PLL may be configured for demodulating amplitude of the drive signal and phase of the $m^{th}$ tooth. The DSP may further include an N-point Fast Fourier Transform (FFT) circuit coupled to an output of the dual channel PLL, a divider for dividing the PM noise by the AM noise output from the N-point FFT circuit to compute an in-situ filter function in a frequency domain, and a CPU configured to calculate digital filter coefficients of a filter function at periodically updated intervals and to apply the filter function to real-time AM noise of the drive signal. The DSP may also comprise a memory for storing the filter function and an operational amplifier for adjusting gain and polarity of a control signal responsive to the AM noise filter by the CPU and applying the control signal to the phase shifter for correcting the phase on the $n^{th}$ tooth.

A method of improving the stability of a frequency enhanced clock is provided. A drive signal is generated. The drive signal is split into a first portion and a second portion. A phononic frequency comb is generated in response to the first portion of the drive signal. A phase modulation (PM) noise of an $m^{th}$ tooth of the phononic frequency comb is divided by an amplitude modulation (AM) noise of the drive signal to compute a filter function. The $m^{th}$ tooth preferably has highest PM/AM noise conversion. The filter function is applied to a real-time demodulated AM noise, and a phase of an n tooth of the phononic frequency comb is corrected in response to the filter function. The $n^{th}$ tooth of the phononic frequency comb may be selected from one that is least sensitive to frequency changes of the drive signal.

In some embodiments, the AM noise of the second portion of the drive signal and the PM noise of an $m^{th}$ tooth of the phononic frequency comb are demodulated before dividing the PM noise of the $m^{th}$ tooth by the AM noise of the drive signal to compute the filter function. Fourier transform may be performed on the demodulated AM noise and the PM noise before computing the filter function. Adjustment of gain and polarity of a control signal responsive to the filter function may be performed for correcting an $n^{th}$ tooth of the phononic frequency comb.

A system for a frequency comb enhanced clock is provided. The system includes a first oscillator for generating a drive signal; a nonlinear resonator for generating a phononic frequency comb in response to the drive signal; a second oscillator for selecting and correcting an $n^{th}$ tooth of the phononic frequency comb; and a transfer function circuit. The transfer function circuit comprises a first circuit and a second circuit. The first circuit is configured for adjusting the phase of an $n^{th}$ tooth of the phononic frequency comb and amplitude of an error signal obtained from the second circuit. to reduce phase noise caused by AM-PM cross-correlated noise. The second circuit is configured for periodically updating a filter function using an uncorrected and relatively noisier tooth. The system may further comprise a phase shifter coupled to an output of the transfer function and the $n^{th}$ tooth of the phononic comb. The second circuit can include a digital signal processor.

Other embodiments of this presentation comprise a comb enhanced oscillator having: a first oscillator for generating a drive signal; a signal splitter for splitting the drive signal into first and second signals; a nonlinear resonator responsive to the first signal for producing a phononic frequency comb; a first phase locked loop (PLL) and a second oscillator, the first PLL being responsive to the phononic frequency comb for locking the second oscillator to a first tooth of the phononic frequency comb, wherein said first tooth is least sensitive to frequency changes of the first signal compared to other teeth of the frequency comb; an AM-PM noise correction circuit including at least an amplitude detector and a phase shifter, the amplitude detector of the AM-PM noise correction circuit being arranged for, using a periodic measurement of an AM noise on the second signal and of a PM noise on a second tooth of the phononic frequency comb, calculating and storing an AM to PM transfer function phase correction signal and, applying said stored AM to PM transfer function to a current AM noise on the second signal to generate a PM noise correction signal that causes the phase shifter to produce an output signal of the noise correction circuit for correcting the phase of the second oscillator.

According to embodiments of this presentation, said output signal of the noise correction circuit is used as a clock reference for the two-channel PLL.

According to embodiments of this presentation, the AM-PM noise correction circuit comprises: a first ADC to generate a digital version of the phononic frequency comb; a second ADC to generate a digital version of the second signal; a two-channel phase lock loop (PLL) with a first channel arranged to demodulate the digital version of the phononic frequency comb and a second channel arranged to demodulate the digital version of the second signal; and a digital signal processor (DSP) configured to: measure a PM noise on a second tooth of the phononic frequency comb; measure an AM noise from the output of the second PLL channel; periodically calculate a ratio of the measured PM noise by the measured AM noise; and store said ratio as said AM to PM transfer function phase correction signal; the digital signal processor (DSP) being further configured to generate said PM noise correction signal by multiplying the real-time output of the second PLL channel by said AM to PM transfer function phase correction signal.

Alternative embodiments of this presentation comprise a phononic frequency comb enhanced oscillator comprising: a first oscillator for generating a drive signal; a signal splitter for splitting the drive signal into a first signal and a second signal; a nonlinear resonator responsive to the first signal for producing a phononic frequency comb; an AM-PM noise correction circuit including at least an amplitude detector and a phase shifter, the amplitude detector being configured to use a periodic measurement of an AM noise of the second signal and a PM noise of a second tooth of the phononic frequency comb for calculating and storing filter coefficients for an AM to PM transfer function, and to apply the transfer function to a current AM noise of the second signal to generate a PM noise correction signal that causes the phase shifter to produce a corrected phononic frequency comb equal to said phononic frequency comb having a phase corrected by the PM noise correction signal; a phase locked loop (PLL) and a second oscillator, the phase locked loop being configured to lock the second oscillator to a first tooth of said corrected phononic frequency comb, wherein the first tooth is the least sensitive to frequency changes of the first signal compared to other teeth of the corrected phononic frequency comb.

According to embodiments of this presentation, the output signal of the second oscillator is used as a clock reference of the two-channel PLL According to embodiments of this presentation, the AM-PM noise correction circuit comprises: a first ADC to generate a digital version of the phononic frequency comb; a second ADC to generate a digital version of the second signal; a two-channel phase lock loop (PLL) with a first channel arranged to demodulate the digital version of the phononic frequency comb and a second channel arranged to demodulate the digital version of the second signal; and a digital signal processor (DSP) configured to: measure a PM noise on a second tooth of the phononic frequency comb; measure an AM noise from the output of the second PLL channel; periodically calculate a ratio of the measured PM noise by the measured AM noise; and store said ratio as said AM to PM transfer function phase correction signal; the digital signal processor (DSP) being further configured to generate said PM noise correction signal by multiplying the real-time output of the second PLL channel by said AM to PM transfer function phase correction signal.

According to embodiments of this presentation, said second tooth has higher AM/PM noise conversion compared to other teeth of the frequency comb.

DETAILED DESCRIPTION

Figure 1A:
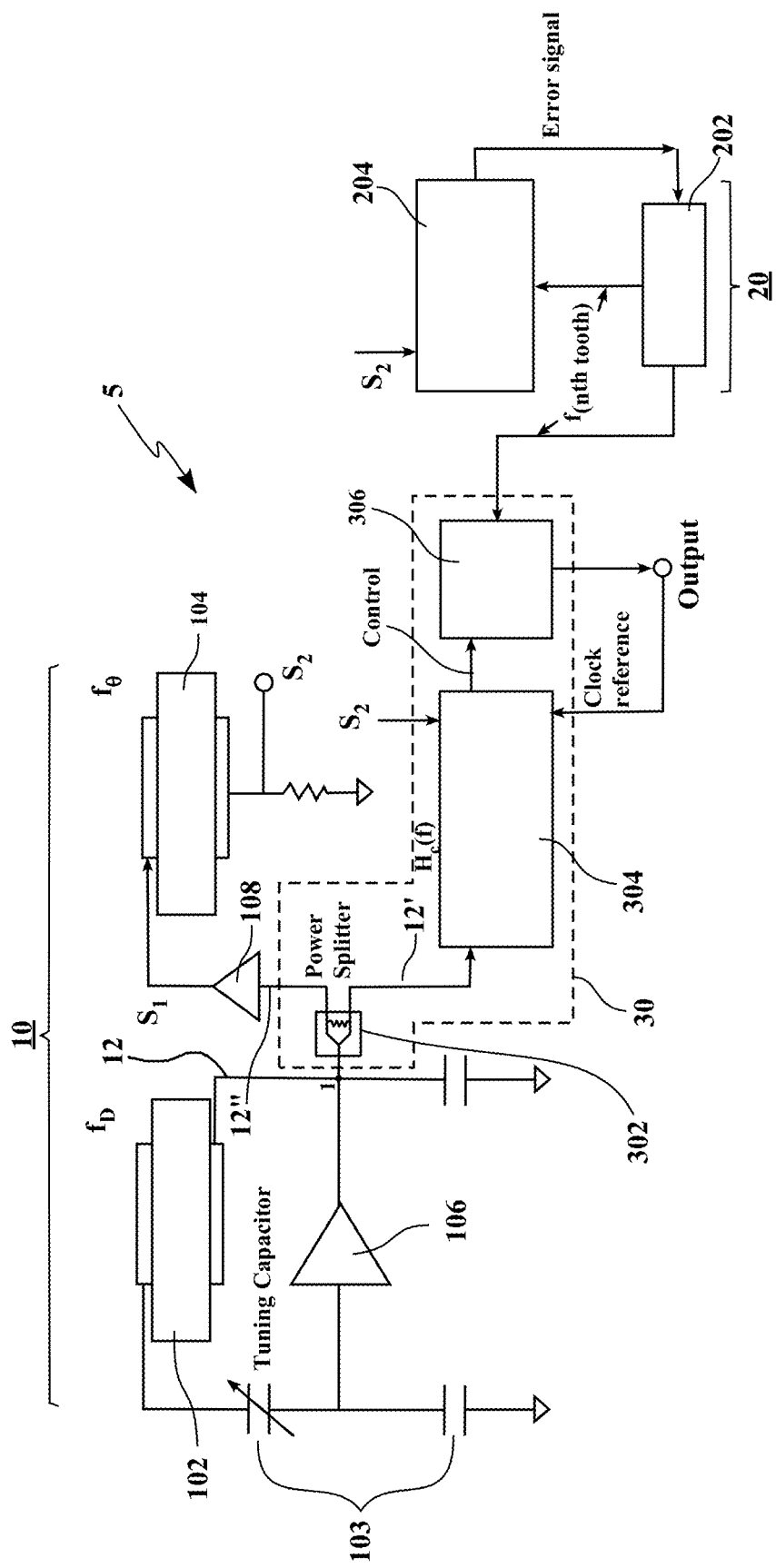
FIG. 1A shows circuitry of a phononic comb enhanced clock with dynamic control of a transfer function filter for correcting AM-to-PM noise conversion in a nonlinear resonator according to an embodiment of this presentation.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Currently, temperature-controlled crystal oscillators (TCXOs) and oven-controlled crystal oscillators (OCXOs) are considered the best performing low c-SWaP clocks compared to atomic clock-based systems. TCXOs require lower power (in the range of about 10 mW), while miniaturized commercial OCXOs typically require power (in the range of hundreds of mW) and are more costly than TCXOs. However, long-term stability of atomic clocks may be many orders of magnitude better than a TCXO or OCXO, while atomic clocks can be noisy over short time periods due to the statistical nature of the atomic transitions. The typical short-term fractional frequency deviations (ADEV) of most portable clocks are around $10^{-11}$ at 1 sec integration times and are determined by the reference oscillator. Both long- and short-term stability are needed for many applications such as radar and timing synchronization. A technique to reduce the phase noise of any existing clock used as the drive signal to a nonlinear resonator is desired.

Phononic frequency combs in quartz resonators with unique properties of the teeth of the frequency combs suggest that a reduction of the phase noise of oscillators by about 20 to about 40 dB in a wide frequency range may be possible. This frequency range is dictated by the spacing between the teeth of the frequency comb. The widest teeth spacing reported to date of any phononic frequency comb may range from about 100 kHz to about 250 kHz. In addition, the Inventors have noted that AM and PM noise is highly correlated on the comb teeth. This allows one to measure the phase noise on one tooth and use such information for correcting the phase noise of other teeth. A corrected tooth can then be used as a reference clock for a digital processor to measure the higher noise on other teeth and perform in-situ filter calculations. As a result, no additional clock is needed for the digital processor.

According to one embodiment, an apparatus and method are disclosed herein for increasing the stability of quartz oscillators by using a phononic comb generated in a nonlinear resonator, for example, a quartz microelectromechanical system (MEMS) resonator. Such a frequency comb has been shown to exhibit regions in which the frequency of some tooth is insensitive (or substantially insensitive) to changes of the difference between a drive frequency and the resonator modal frequencies of the nonlinear resonator. The drive frequency may be derived from a crystal oscillator, or "drive oscillator" that may be embodied by another quartz MEMS resonator. By using these "low sensitivity" teeth frequencies as references in a phase-locked loop (PLL), a voltage-controlled crystal oscillator (VCXO) can be stabilized to these reference frequencies of the frequency comb, as follows.

A phononic comb can be produced through modal mixing of local modes within a resonator that is driven slightly off one of its resonant frequencies. As outlined above, the comb teeth can exhibit regions of low drive frequency sensitivity. These regions of low drive frequency sensitivity may exist on either the right side or the left side of the drive frequency, that is, higher or lower frequency than the drive frequency. This effect can be utilized to provide a high stability reference for locking a second VCXO. Thus, the output of the second VCXO can be stabilized compared to its own native stability. This can be done with only a modest increase in size and power compared to a single VCXO since multiple MEMS-based VCXOs can be integrated in arrays on a single Si wafer with each resonator only requiring <1 mm$^2$.

Figure 2:
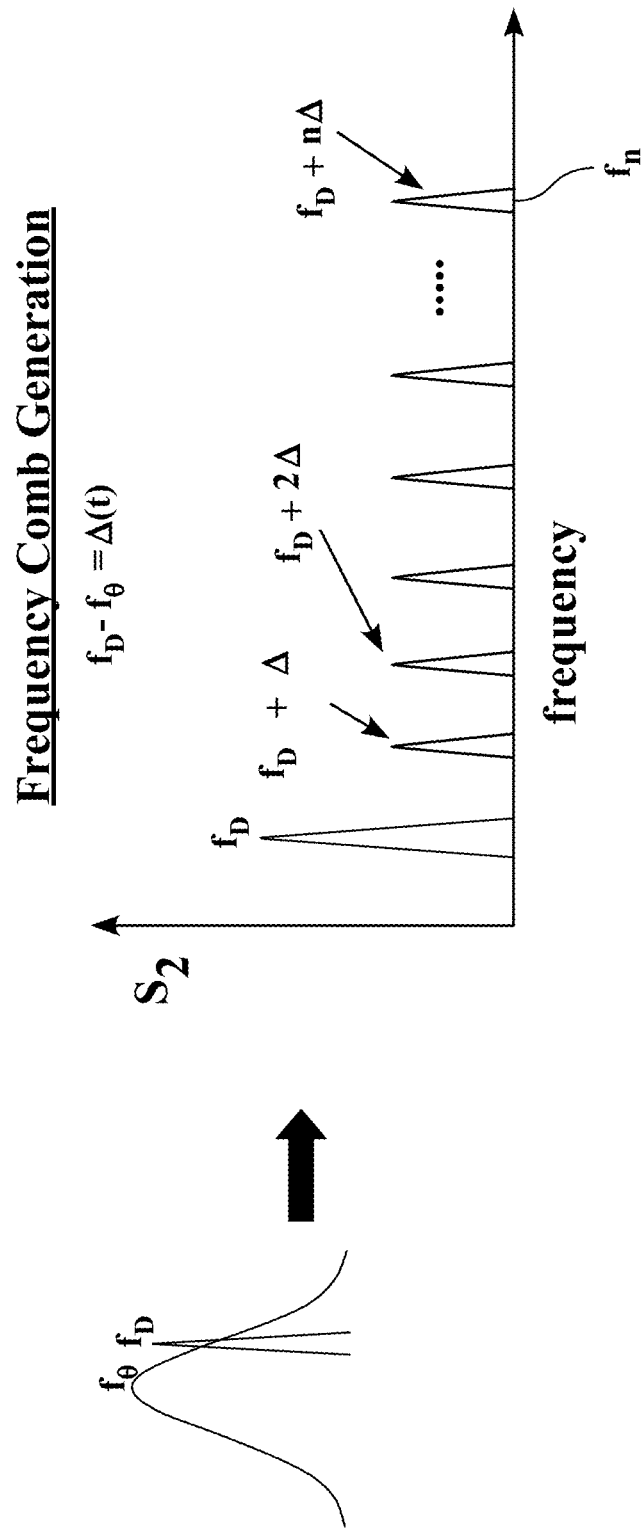
FIG. 2 is a diagram of a phononic frequency comb generated by the nonlinear resonator 104 as shown in FIG. 1.

FIG. 1A, illustrates a comb enhanced oscillator, or phononic frequency comb enhanced clock, 5 according to embodiments of this presentation, provided with an AM-to-PM noise correction circuitry 30 to improve stability of its phase noise. The phononic frequency comb enhanced clock 5 includes a first VCXO 10 and a second VCXO 20. The first VCXO 10 includes a resonator 102, for example, a quartz crystal oscillator, arranged in a voltage control loop that comprises a gain controller 106 and a tuning capacitor network 103, to generate a drive signal 12 having a frequency $f_D$. Optionally, the first VCXO 10 may further includes an automatic gain controller 108 to amplify and stabilize the drive signal 12 output from the gain controller 106. The output of gain controller 106 or, alternatively, an output $S_1$ of the automatic gain controller 108 can be input to a nonlinear resonator 104, for example, a quartz nonlinear crystal oscillator (NLXO), to generate a frequency comb S2 as shown in FIG. 2. In some embodiments, the first VCXO 10 and the second VCXO 20 may be selected from MEMS-based oscillators integrated on a single semiconductor substrate such as a Si substrate. The NLXO 104 may include an SC-cut or AT-cut quartz shear-mode resonator according to some embodiments. In one embodiment, the nonlinear resonator 104 has a resonant mode at a frequency $f_\theta$. With appropriate modal coupling within the resonator 104 at drive levels below the nonlinear Duffing bifurcation condition (for which $f_\theta$ is strongly dependent on the amplitude of $S_1$), a frequency comb $S_2$ is generated as shown in FIG. 2. The nonlinear response in the preferably quartz material of the resonator is evidenced by the generation of a frequency comb at $f_\theta$, $f_\theta \pm \Delta$, $f_\theta \pm 2\Delta$, $f_\theta \pm 3\Delta$, . . . , and $f_\theta \pm n\Delta$, where $\Delta \approx f_D - f_\theta$.

As shown in FIG. 1A, the AM-to-PM noise correction circuitry 30 can include a power splitter 302 that splits the drive signal 12 of a frequency $f_D$ into two portions, including a first portion 12" supplied to the resonator 104 after being amplified and stabilized by the automatic gain controller 108 and a second portion 12' to be processed by a transfer function $H_c(f)$ device 304. The transfer function device 304 may include a noise correction circuit in the form of a periodically updated filter for producing correction signal for a phase shifter 306. Both the amplitude and phase of the correction signal are tailored to produce a desired phase correction on the output. The filter response can be calculated by periodically dividing the PM noise of a comb tooth in the frequency domain by the AM noise on the drive signal 12 in a region of the phase noise spectrum where AM-to-PM noise is the dominant noise source. Once calculated, the transfer function may be stored and used for correction of AM-to-PM noise conversion subsequently. The inventors have noted that the amplitude or phase spectrum of the transfer function may change, for example, in response to changes in Q, temperature, stress, or other parameters of the resonator due to environmental factors or aging, and that therefore a new transfer function may be needed periodically. By periodically measuring the AM noise on the drive signal and the PM noise on an uncorrected comb tooth, an updated transfer function can be calculated and applied to the phase shifter. The lower phase noise signal from the n$^{th}$ tooth of the frequency comb can then be used as the timing reference for a digital processor for subsequent transfer function updates.

Since the AM to PM noise conversion can be a function of which tooth of the frequency comb is observed, one of the preferred implementations includes locking the PLL of the resonator 202 to a low noise tooth (hereafter the n$^{th}$ tooth) while selecting a tooth with higher AM/PM noise conversion (hereafter the m$^{th}$ tooth) for calculating the updated filter transfer function. This would provide the highest accuracy for the AM/PM noise correction and/or cancellation.

Figure 3:
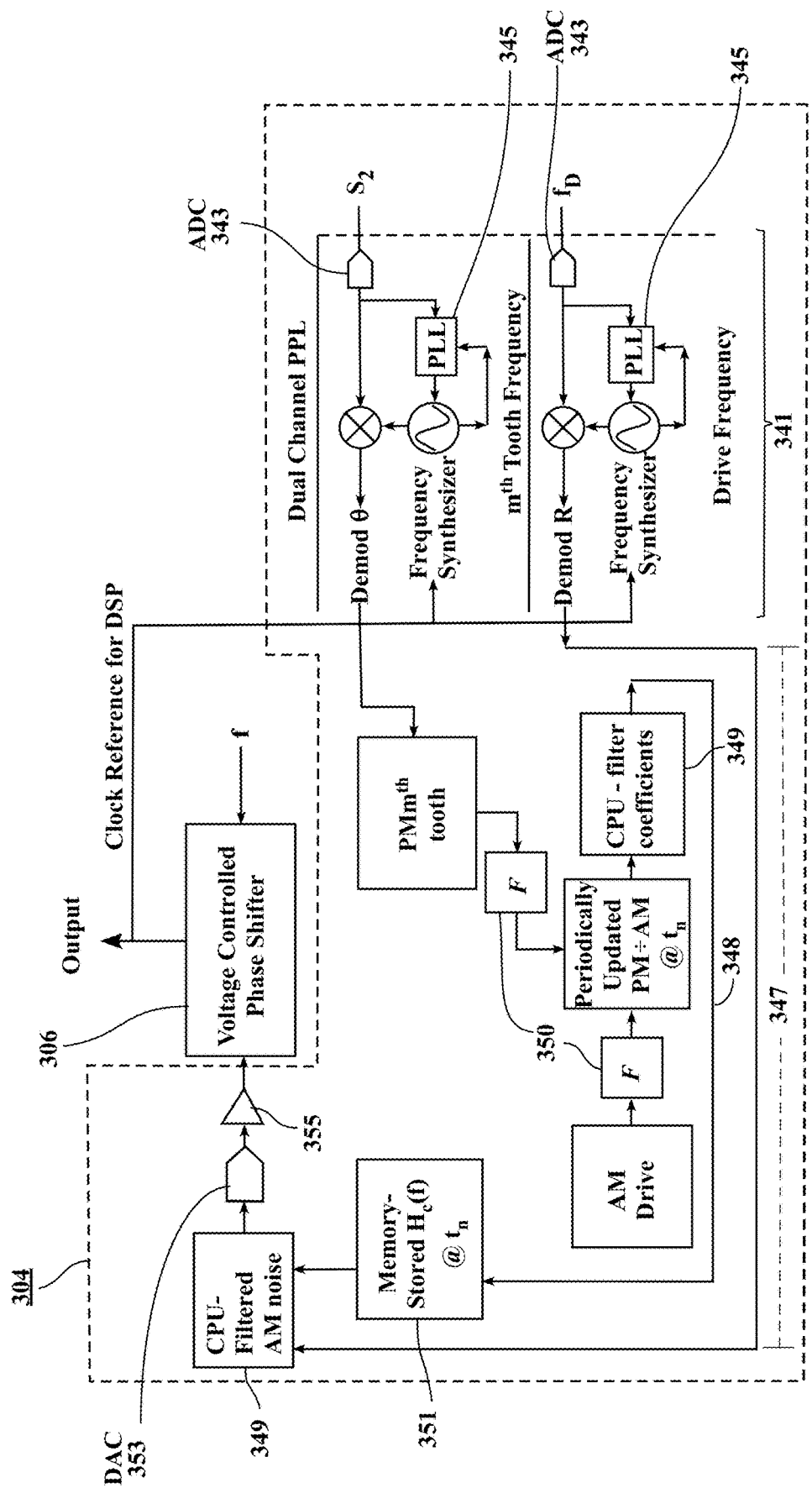
FIG. 3 is a block diagram of the transfer function filter as shown in FIG. 1 according to an embodiment of this presentation.

A method for updating the filter transfer function device 304 is now described with reference to FIGS. 1A and 3. As shown in FIG. 3, the transfer function device 304 can include a dual channel PLL 341 with one channel input connected to the output $S_2$ of the NLXO 104 and another channel input connected to an output 12' (a portion of signal 12 of frequency $f_D$) from the power splitter 302. Each of the channels of the dual-channel digital PLL 341 can include an analog-to-digital converter 343 and a PLL unit 345. The split drive signal 12' and the comb output $S_2$ are supplied to respective ADCs 343 within the dual-channel digital PLL 341. One of the channels of the PLL 341 can calculate the demodulated phase noise or quadrature (Q) data of the m$^{th}$ tooth of $S_2$, while the other channel of the dual channel digital PLL 341 can demodulate the amplitude noise or in-phase (I) data of the drive signal 12. These time-dependent signals are transferred into frequency domain by Fourier transform. In some embodiment, N-points Fast Fourier Transform circuits 350 may be used for performing the Fourier transform. The transfer function 304 further includes a digital signal processor (DSP) 347 which includes a divider 348 to divide the PM noise by the AM noise at preselected time intervals ($t_n$). The DSP 347 can include a CPUs 349 programmed to run iterations to optimize the fitting parameters of a multi-pole finite impulse response (FIR) or infinite impulse response (IIR) filter to match the measured PM/AM noise function. These parameters are stored in a memory unit 351 and updated at each to time step. (An initial set of parameters can be loaded into memory unit 351 for the initial start-up.) The demodulated AM noise is then digitally filtered in real time using these updated filter functions, and the resulting time-dependent signal is converted to an analog signal using a digital-to-analog converter (DAC) 353. The gain and polarity of the phase noise correction signal can then be adjusted by a gain and polarity controller 355 prior to being applied to an analog phase shifter 306 to take into account the voltage/phase transfer function of the phase shifter 306. The temporal lag through the demodulators and DSP 347 is not expected to create phase errors since the AM that is being corrected is slow (roughly <10 kHz) compared to typical processing delays of microseconds to nanoseconds.

As illustrated in FIG. 1A, the phononic frequency comb enhanced clock further includes another VCXO 20, which includes a quartz resonator 202 similar to the quartz resonator 102 of the VCXO 10. In most oscillators, the far-out phase noise is determined by the electronic noise in a sustaining circuit. This noise will not be present on the modes of resonator which are not used within a sustaining loop. Therefore, as shown in FIG. 1A, the VCXO 20 can be locked to a selected tooth, for example, the $n^{th}$ tooth of the frequency comb $S_2$, using a PLL 204 to stabilize the output frequency of the VCXO 20. The PLL 204 may include a part functioning as a mixer and a part functioning as a phase ($\Phi$) detector. As the entire comb output $S_2$ is applied to the PLL 204 of the resonator 202, the VCXO 20 can be used for selecting the nth comb tooth with reduced phase noise. This tooth may be chosen from one having the least frequency sensitivity to changes in the drive frequency (i.e., a quasi-stationary resonance). In the embodiment as shown in FIGS. 1A and 3, the $n^{th}$ comb tooth $f_n$ selected by the PLL 204 of the VCXO 20 is subsequently phase corrected in the voltage-controlled phase shifter 306. In the embodiment as shown in FIG. 1A, the output of the system comes from the output of the voltage-controlled phase shifter 306. The output of the voltage-controlled phase shifter 306 is also applied back to the DSP 347 in transfer function device 304 for its internal timing reference. This embodiment will have reduced intermodulation distortion in the phase shifter 306.

Figure 1B:
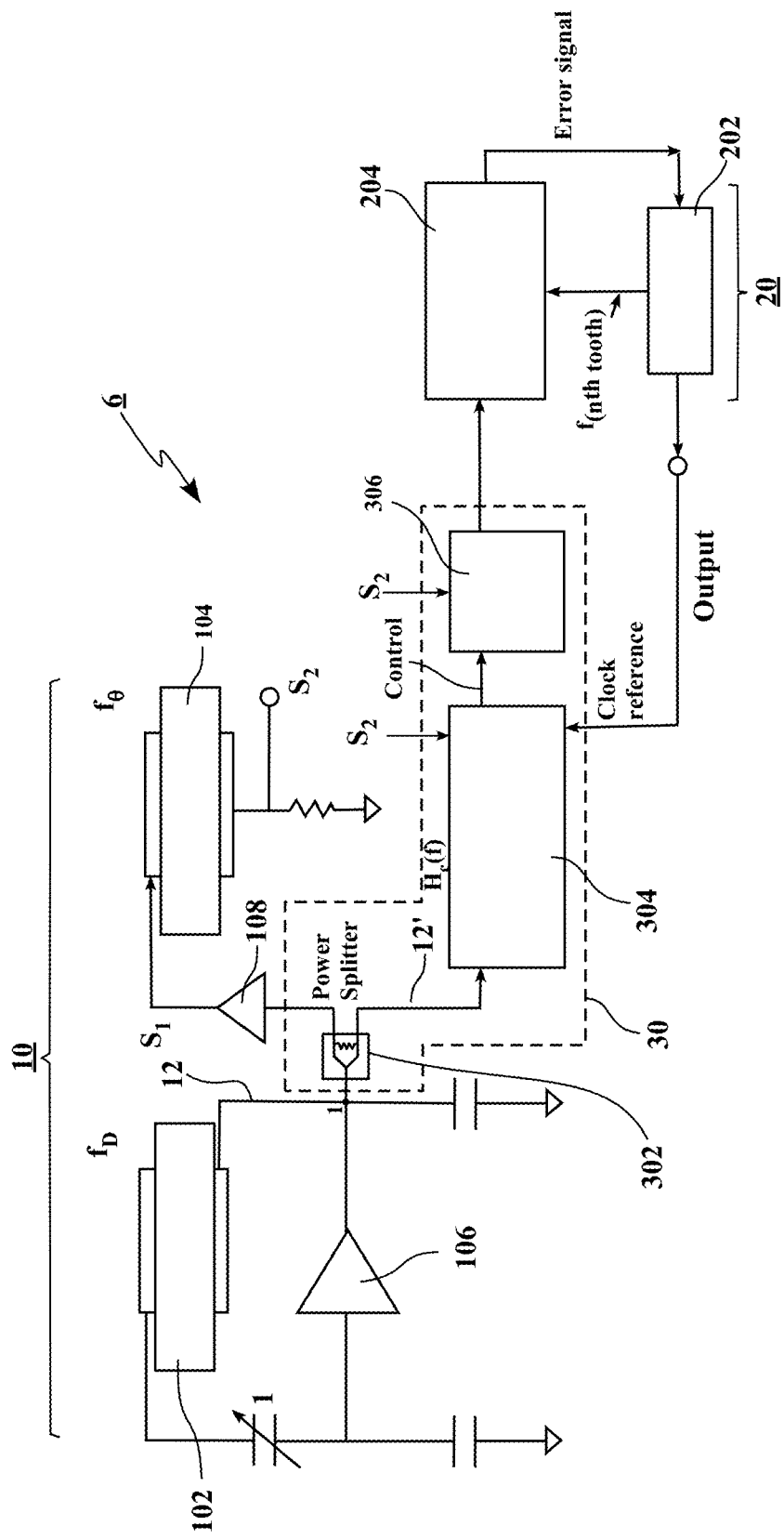
FIG. 1B shows a modification of the phononic comb enhanced clock as shown in FIG. 1 according to some embodiments.

According to some embodiments, the phononic enhanced clock 5 as shown in FIG. 1A may be modified to a phononic enhanced clock 6 as illustrated in FIG. 1B, in which the comb signal $S_2$ is applied to both the transfer function device, namely, the noise correction circuit 304, and the phase shifter 306. As shown in FIG. 1B, in the modified phononic enhanced clock, the phase correction is applied to the entire comb by phase shifter 306 and the PLL 204 is used to select the $n^{th}$ comb tooth with the lowest phase noise after the AM/PM noise correction. The clock reference for the noise correction circuit 304 is now obtained directly from the output of the second oscillator 20.

In other words, FIGS. 1A and 1B illustrate comb enhanced oscillator devices 5 and 6 that each comprise a first oscillator (102, 106, 103) for generating a drive signal 12, a signal splitter 302 for splitting the drive signal 12 into first 12" and second 12' signals, a nonlinear resonator 104 responsive to the first signal 12" for producing a phononic frequency comb $S_2$, and a PLL 204 and a second oscillator 202. The PLL 204 locks the second oscillator 202 to a first tooth of the phononic frequency comb $S_2$ in response to the phononic frequency comb $S_2$ for locking, with the first tooth being least sensitive to frequency changes of the first signal compared to other teeth of the frequency comb $S_2$. According to some embodiments, each of the comb enhanced oscillator devices 5 and 6 further comprises an AM-PM noise correction circuit 30 including at least the transfer function device 304, which may also be referred to as a noise correction circuit or an amplitude detector, and a phase shifter 306. The transfer function device 304 of the AM-PM noise correction circuit 30 may be arranged to use a periodic measurement of an AM noise on the second signal 12' and a PM noise on another tooth of the phononic frequency comb $S_2$ to calculate and store an AM to PM transfer function phase correction signal and apply the stored AM to PM transfer function to a current AM noise on the second signal to generate a PM noise correction signal (control) that, in FIG. 1A, causes the phase shifter 306 to produce an output signal of the noise correction circuit 30 that is equal to the output of the second oscillator 202 with a phase corrected by the PM noise correction signal. Alternatively, in the embodiment of FIG. 1B, the phase shifter 306 is arranged to receive the whole phononic frequency comb $S_2$ instead of only the output of the second oscillator 2. The PM noise correction signal causes the phase shifter 306 to correct a phase of the whole phononic frequency comb $S_2$ and it is this phase-corrected phononic frequency comb $S_2$ that is fed to the PLL 204 instead of the (non-phase corrected) comb $S_2$ as illustrated in FIG. 1A. An output signal of the circuit 6 in FIG. 1B is the output of the second oscillator 202. The transfer function can be updated periodically as needed, but may typically have a period of several seconds to hours, depending on the operating conditions of the oscillator. According to some embodiments, the another tooth has higher AM/PM noise conversion compared to other teeth of the frequency comb.

As illustrated in FIG. 3, the amplitude detector of the AM-PM noise correction circuit comprises a first ADC 343, a second ADC 343, a two-channel PLL 341, and a DSP 347. The first ADC 343 generates a digital version of the phononic frequency comb $S_2$. The second ADC 343 generates a digital version of the second signal 12'. The two-channel PLL 341 includes a first channel arranged to demodulate the digital version of the phononic frequency comb $S_2$ and a second channel arranged to demodulate the digital version of the second signal 12'. The DSP 347 measures a PM noise on the second tooth of the phononic frequency comb $S_2$ from the output of the first PLL channel and transfers the PM noise into the frequency domain by Fourier transform 350. The DSP 347 further measures an AM noise from the output of the second PLL channel and transfers the AM noise into the frequency domain by Fourier transform 350. The DSP 347 further periodically calculate 348 a ratio of the measured PM noise by the measured AM noise, calculates optimized filter coefficients in the CPU 349, and stores in the memory 351 the optimized filter coefficients. In some embodiments, the DSP 347 generates the PM noise correction signal by multiplying the output of the second PLL channel by the AM-to-PM filter transfer function 349. According to some embodiment, the output signal of the noise correction circuit 30 is used as a clock reference for the two-channel PLL 341.

Figure 4:
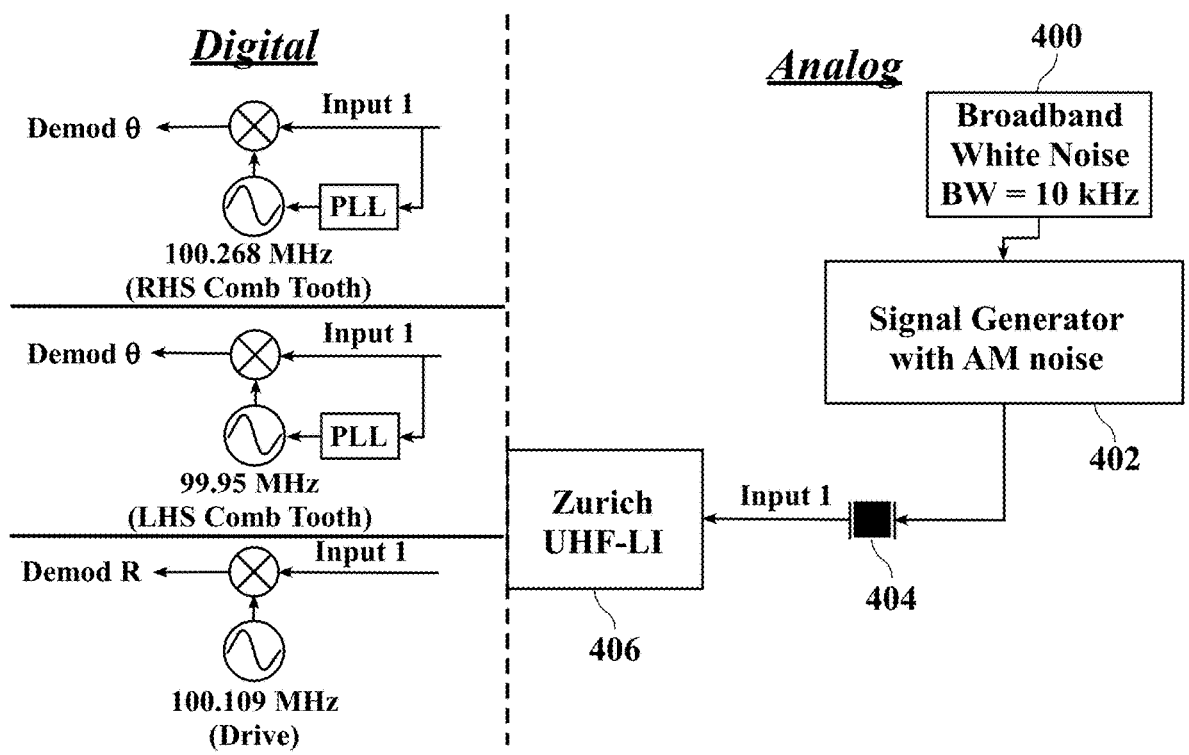
FIG. 4 is a block diagram of an exemplary set-up used to measure the phase and amplitude of noise on the teeth with an AM injected noise on a drive signal.

The justification for the phase correction technique hereby disclosed has been examined using the experimental set up shown in FIG. 4. A broadband white noise source 400 was used to inject AM noise with a BW of 10 kHz into a signal generator 402, for example, a 100-MHz carrier. The output of the signal generator 402 was used to drive a nonlinear element 404 similar to the quartz resonator 104 as shown in FIG. 1. The comb signal generated by the nonlinear resonator 404 was sampled by a lock-in amplifier 406, for example, a dual-channel ultra-high frequency (UHF) lock-in amplifier. Both the right-hand side (RHS) and left-hand side (LHS) teeth relative to the drive frequency were demodulated and their time domain phase noise was computed. The AM noise on the drive was also measured. The time domain signals on the RHS and LHS teeth on either side of the drive frequency are shown in FIG. 5, and the relative phase noise of each signal is shown in FIG. 6 along with the AM noise as a function of the offset frequency away from the carrier 402.

Figure 5:
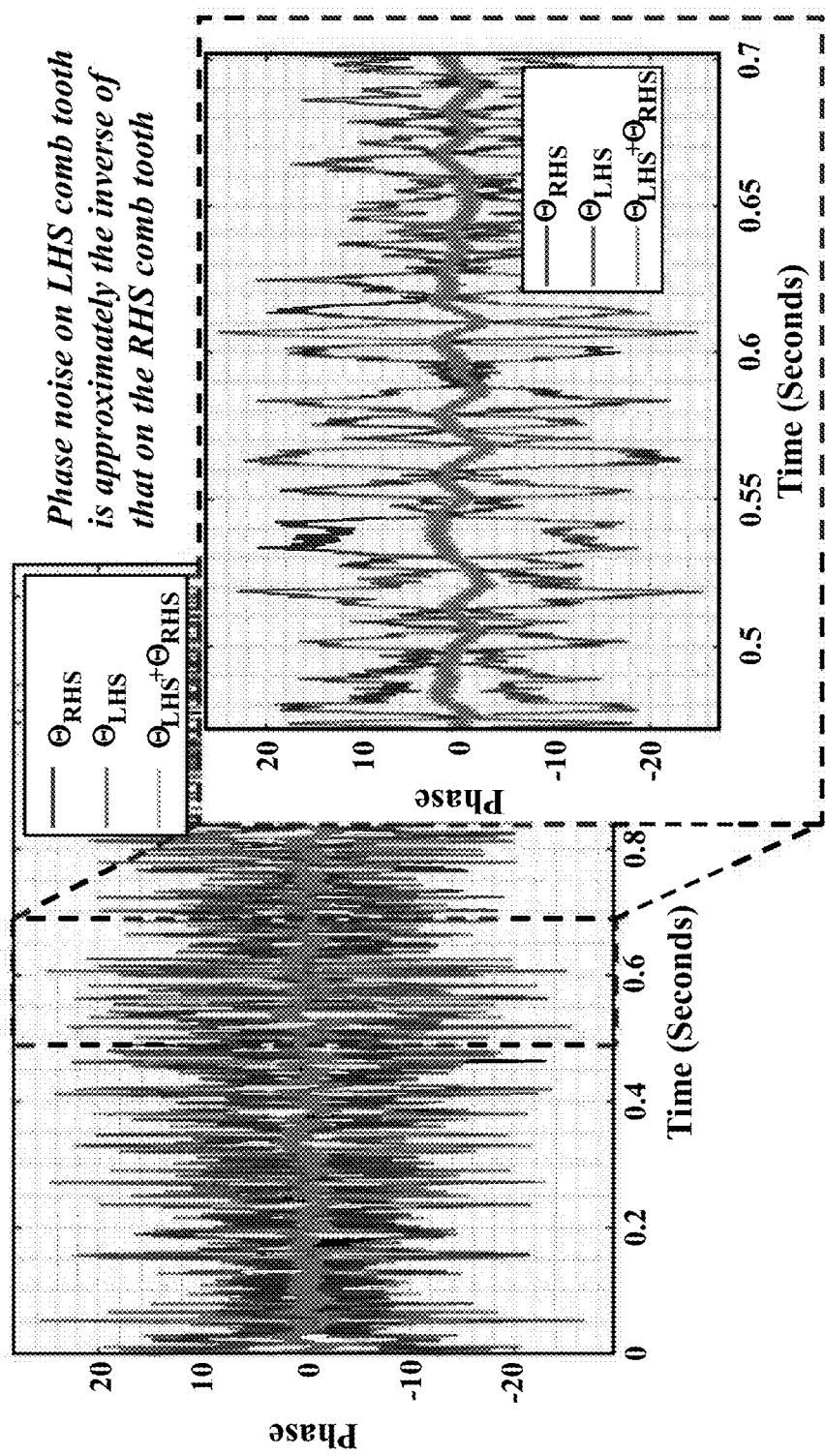
FIG. 5 is a graph of time domain phase noise on the left-hand-side (LHS) and right-hand-side (RHS) teeth with AM noise on the drive signal.
Figure 6:
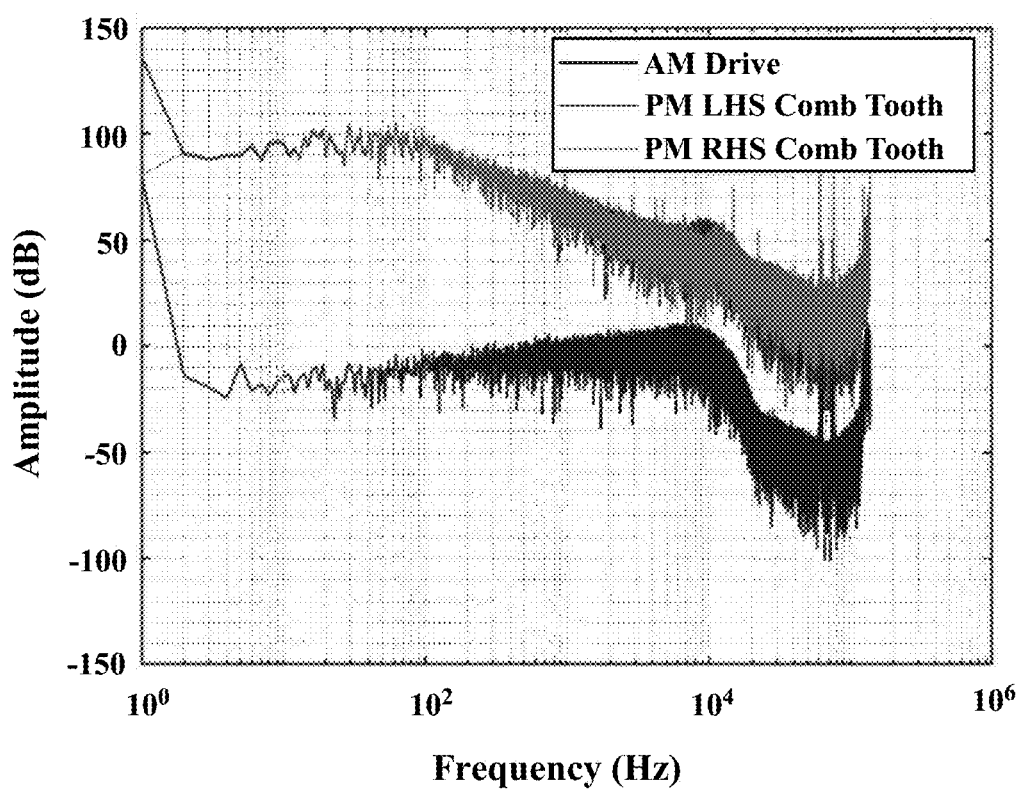
FIG. 6 is a graph of the frequency domain phase noise on the LHS and RHS teeth and the AM noise on the drive signal.
Figure 7A:
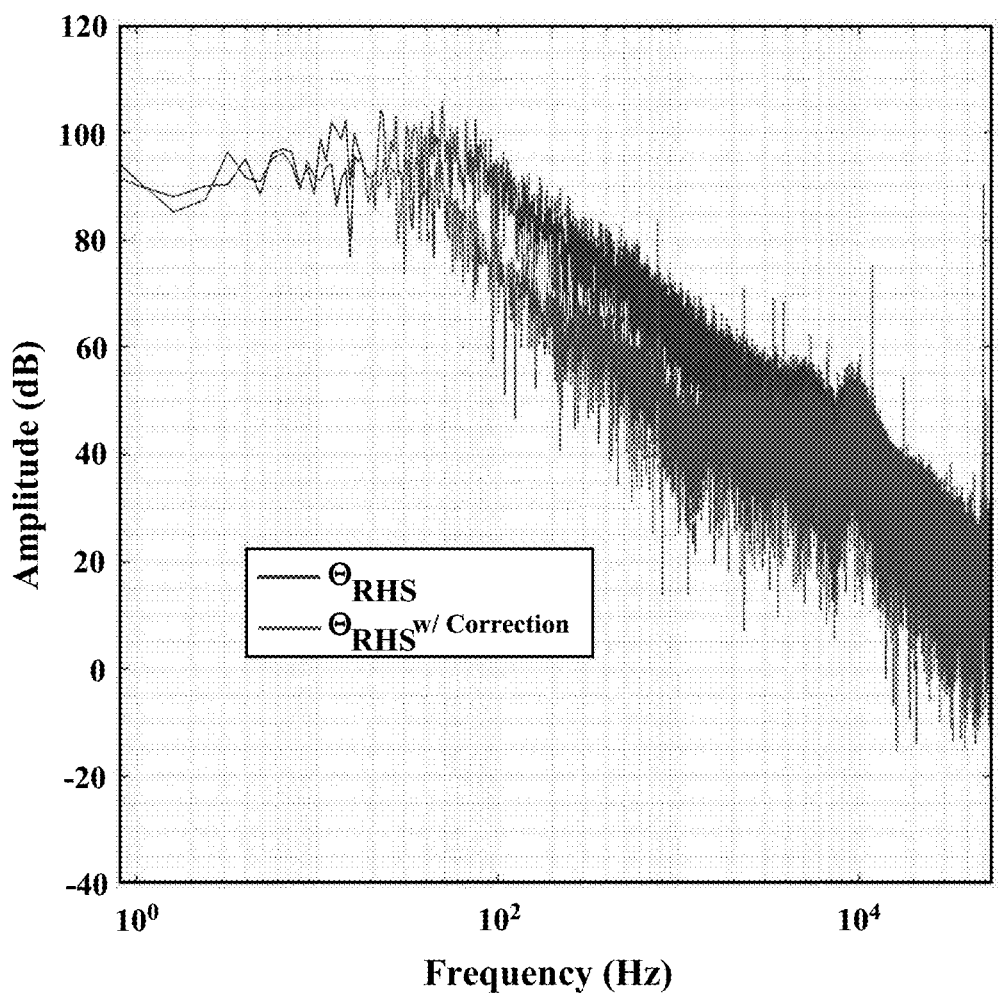
FIG. 7(a) is a graph of the phase noise reduction on the RHS tooth using the RHS tooth to calculate a filter transfer function.
Figure 7B:
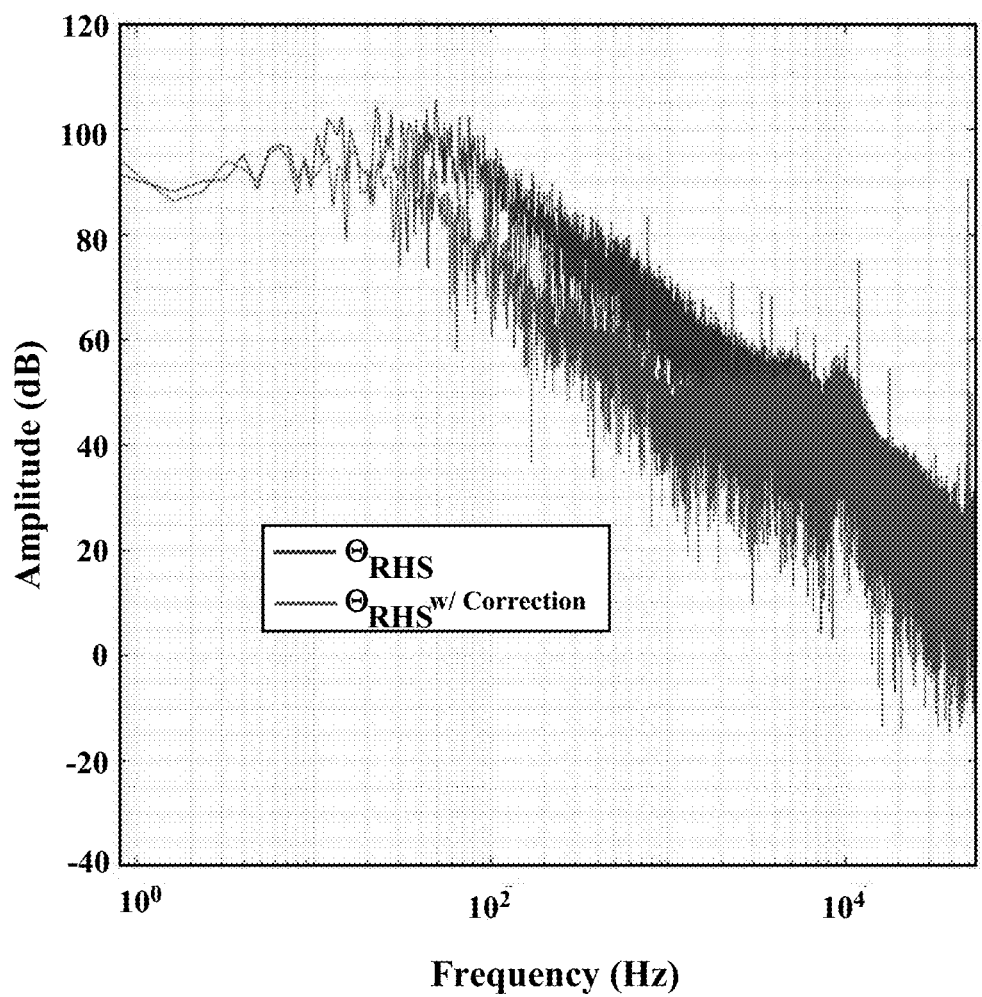
FIG. 7(b) is a graph of the phase poise reduction of the RHS tooth using the LHS to calculate a filter transfer function.

As shown in FIGS. 5 and 6, there is a high degree of anti-correlation between the two time domain phase noise signals. The $H_c(f)$ transfer function (in this case defined as PN(f) (LHS or RHS tooth)/AM(f) noise of drive) was then calculated using each signal over a specified time interval, and the resulting phase corrected signal from the RHS tooth using subsequent stored data exhibited similar reductions in phase noise using either transfer function as shown in FIGS. 7(a) and 7(b). Thus, an updated $H_c(f)$ transfer function can be calculated using an uncorrected noisier tooth and applied periodically to a lower noise tooth. Advantageously, by feeding back the corrected signal to the digital processor, these updates can be accomplished without the need of a separate low noise reference for measuring the phase noise of the uncorrected teeth.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for" and no method or process step herein is to be construed under those provisions unless the step, or steps, are expressly recited using the phrase "comprising the step(s) of."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A phononic frequency comb enhanced clock, comprising:
    a nonlinear resonator configured to generate a phononic frequency comb in response to a drive signal; and
    an amplitude modulation (AM) to phase modulation (PM) noise correction circuit, comprising:
    a transfer function circuit comprising:
        a two-channel phase lock loop (PLL) with one channel input from the phononic frequency comb and another channel input from at least a portion of the drive signal; and
        a digital signal processor (DSP) configured to divide a PM noise of a predetermined tooth ($m^{th}$ tooth) of the phononic frequency comb by an AM noise of the portion of the drive signal to generate a noise correction signal, wherein the predetermined tooth has higher AM/PM noise conversion compared to other teeth of the frequency comb, calculate filter coefficients for a digital filter function; and
    a phase shifter having an input coupled to an output of the digital signal processor and another input connected to a frequency signal of a preselected tooth ($n^{th}$ tooth) of the frequency comb, wherein the preselected tooth is least sensitive to frequency changes of the drive signal compared to other teeth of the frequency comb.

2. The phononic frequency comb enhanced clock of claim 1, further comprising:
    a first resonator for generating the drive signal; and
    a second resonator for preselecting the $n^{th}$ tooth.

3. The phononic frequency comb enhanced clock of claim 2, wherein the first resonator and the second resonator include MEMS-based oscillators integrated in a single semiconductor substrate.

4. The phononic frequency comb enhanced clock of claim 1, wherein the nonlinear resonator includes an SC-cut or AT-cut quartz shear-mode resonator.

5. The phononic frequency comb enhanced clock of claim 1, wherein the DSP is programmed to optimize fitting parameters of an FIR or IIR filter to match the PM/AM noise in the form of a time dependent filter function.

6. The phononic frequency comb enhanced clock of claim 1, wherein the DSP further comprises a memory to store an initial set of the filter coefficients and the updated filter coefficients.

7. The phononic frequency comb enhanced clock of claim 1, further comprising:
    a PLL with an input connected to the frequency comb; and
    a resonator connected to an output of the PLL for preselecting the $n^{th}$ tooth and configured to output a frequency signal of the $n^{th}$ tooth.

8. The phononic frequency comb enhanced clock of claim 7, wherein the resonator is configured to output the preselected tooth frequency to the phase shifter.

9. The phononic frequency comb enhanced clock of claim 7, wherein the resonator outputs the corrected frequency signal of the $n^{th}$ tooth to the DSP for internal timing reference and to the dual channel PLL for front-end demodulation of the AM noise of the drive signal.

10. The phononic frequency comb enhanced clock of claim 1, wherein the dual channel PLL for demodulating amplitude of the drive signal and phase of the $m^{th}$ tooth.

11. The phononic frequency comb enhanced clock of claim 10, wherein the DSP further comprising:
- an N-point Fast Fourier Transform (FFT) circuit coupled to an output of the dual channel PLL;
- a divider for dividing the PM noise by the AM noise output from the N-point FFT circuit to compute an in-situ filter function in a frequency domain; and
- a CPU configured to calculate digital filter coefficients of a filter function at periodically updated intervals and to apply the filter function to real-time AM noise of the drive signal.

12. The phononic frequency comb enhanced clock of claim 11, wherein the DSP further comprising:
- a memory for storing the filter function; and
- an operational amplifier for adjusting gain and polarity of a control signal responsive to the AM noise filter by the CPU and applying the control signal to the phase shifter for correcting the phase on the $n^{th}$ tooth.

13. A method of improving the stability of a phononic frequency comb enhanced clock, comprising:
- generating a drive signal;
- splitting the drive signal into a first portion and a second portion;
- generating a phononic frequency comb in response to the first portion of the drive signal;
- dividing phase modulation (PM) noise of an $m^{th}$ tooth of the phononic frequency comb by amplitude modulation (AM) noise of the drive signal to compute a filter function, wherein the $m^{th}$ tooth has highest AM/PM noise conversion; and
- applying the filter function to a real-time demodulated AM noise; and
- correcting phase of an $n^{th}$ tooth of the phononic frequency comb in response to the filter function, wherein the $n^{th}$ tooth of the phononic frequency comb is least sensitive to frequency changes of the drive signal.

14. The method of claim 13, further comprising:
- demodulating AM noise of the second portion of the drive signal; and
- demodulating PM noise of an $m^{th}$ tooth of the phononic frequency comb before dividing the PM noise of the $m^{th}$ tooth by the AM noise of the drive signal to compute the filter function.

15. The method of claim 14, further comprising:
- performing Fourier transform on the demodulated AM noise and the PM noise before computing the filter function.

16. The method of claim 13, further comprising adjusting gain and polarity of a control signal responsive to the filter function for correcting an $n^{th}$ tooth of the phononic frequency comb, wherein the $n^{th}$ tooth of the phononic is selected from one tooth having least sensitivity to frequency changes of the drive signal.

17. A system for a phononic frequency comb enhanced clock, comprising:
- a first oscillator for generating a drive signal;
- a nonlinear resonator for generating a phononic frequency comb in response to the drive signal;
- a second oscillator for selecting and correcting an $n^{th}$ tooth of the phononic frequency comb;
- a transfer function circuit, comprising:
  - a first circuit for measuring the phase noise of an $m^{th}$ tooth of the phononic frequency comb and the amplitude noise of the drive signal to reduce phase noise caused by AM-PM cross-correlated noise on said $n^{th}$ tooth; and
  - a second circuit for periodically updating a filter function using an uncorrected relative noiser tooth.

18. The system of claim 17, further comprising a phase shifter coupled to an output of the transfer function and the $n^{th}$ tooth of the phononic comb.

19. The system of claim 17, wherein the first circuit includes a dual channel PLL and the second circuit includes a digital signal processor.

20. A phononic frequency comb enhanced oscillator comprising:
- a first oscillator for generating a drive signal;
- a signal splitter for splitting the drive signal into a first signal and a second signal;
- a nonlinear resonator responsive to the first signal for producing a phononic frequency comb;
- a phase locked loop (PLL) and a second oscillator, the phase locked loop being configured to lock the second oscillator to a first tooth of the phononic frequency comb, wherein the first tooth is the least sensitive to frequency changes of the first signal compared to other teeth of the phononic frequency comb;
- an AM-PM noise correction circuit including at least an amplitude detector and a phase shifter, the amplitude detector being configured to use a periodic measurement of an AM noise of the second signal and a PM noise of a second tooth of the phononic frequency comb for calculating and storing filter coefficients for an AM to PM transfer function, and to apply the transfer function to a current AM noise of the second signal to generate a PM noise correction signal that causes the phase shifter to produce an output signal of the AM-PM noise correction circuit that is equal to an output of the second oscillator with a phase corrected by the PM noise correction signal.

21. The phononic frequency comb enhanced oscillator of claim 20, wherein the second tooth has a higher AM/PM noise conversion compared to other teeth of the frequency comb.

22. The phononic comb enhanced oscillator of claim 20, wherein the amplitude detector comprises:
- a first analog to digital converter (ADC) configured to generate a digital version of the phononic frequency comb;
- a second ADC configured to generate a digital version of the drive signal;
- a two-channel phase locked loop (PLL), including a first channel configured to phase demodulate the digital version of the phononic frequency comb and a second channel configured to amplitude demodulate the digital version of the phononic frequency comb; and
- a digital signal processor configured to:
  - measure a PM noise on a second tooth of the phononic frequency comb from an output of the first channel and transform the PM noise into a frequency domain;
  - measure an AM noise of an output of the second channel and transform the AM noise into a frequency domain;
  - periodically calculate a ratio of the transformed PM noise by the transformed AM noise;
  - store the filter coefficients as a filter transfer function; and
  - generate the PM noise correction signal by multiplying real-time output of the second channel by the transfer function.

23. The phononic frequency comb enhanced oscillator of claim 22, wherein the output signal of the noise correction circuit is used as a clock reference of the two-channel PLL.

24. A phononic frequency comb enhanced oscillator comprising:
- a first oscillator for generating a drive signal;
- a signal splitter for splitting the drive signal into a first signal and a second signal;
- a nonlinear resonator responsive to the first signal for producing a phononic frequency comb;
- an AM-PM noise correction circuit including at least an amplitude detector and a phase shifter, the amplitude detector being configured to use a periodic measurement of an AM noise of the second signal and a PM noise of a second tooth of the phononic frequency comb for calculating and storing filter coefficients for an AM to PM transfer function, and to apply the transfer function to a current AM noise of the second signal to generate a PM noise correction signal that causes the phase shifter to produce a corrected phononic frequency comb equal to said phononic frequency comb having a phase corrected by the PM noise correction signal;
- a phase locked loop (PLL) and a second oscillator, the phase locked loop being configured to lock the second oscillator to a first tooth of said corrected phononic frequency comb, wherein the first tooth is the least sensitive to frequency changes of the first signal compared to other teeth of the corrected phononic frequency comb.

25. The phononic frequency comb enhanced oscillator of claim 24, wherein the second tooth has a higher AM/PM noise conversion compared to other teeth of the frequency comb.

26. The phononic comb enhanced oscillator of claim 24, wherein the amplitude detector comprises:
- a first analog to digital converter (ADC) configured to generate a digital version of the phononic frequency comb;
- a second ADC configured to generate a digital version of the drive signal;
- a two-channel phase locked loop (PLL), including a first channel configured to phase demodulate the digital version of the phononic frequency comb and a second channel configured to amplitude demodulate the digital version of the phononic frequency comb; and
- a digital signal processor configured to:
  - measure a PM noise on a second tooth of the phononic frequency comb from an output of the first channel and transform the PM noise into a frequency domain;
  - measure an AM noise of an output of the second channel and transform the AM noise into a frequency domain;
  - periodically calculate a ratio of the transformed PM noise by the transformed AM noise;
  - store the filter coefficients as a filter transfer function; and
  - generate the PM noise correction signal by multiplying real-time output of the second channel by the transfer function.

27. The phononic frequency comb enhanced oscillator of claim 26, wherein the output signal of the second oscillator is used as a clock reference of the two-channel PLL.

* * * * *